United States Patent
Lee et al.

[11] Patent Number: 6,030,877
[45] Date of Patent: Feb. 29, 2000

[54] ELECTROLESS GOLD PLATING METHOD FOR FORMING INDUCTOR STRUCTURES

[75] Inventors: Chwan-Ying Lee, Tainan; Tzuen-Hsi Huang, Tou Lin, both of Taiwan

[73] Assignee: Industrial Technology Research Institute, Hsin-Chu, Taiwan

[21] Appl. No.: 08/944,498

[22] Filed: Oct. 6, 1997

[51] Int. Cl.[7] .................................................. H01L 21/44
[52] U.S. Cl. .......................... 438/381; 438/678; 438/686; 257/295; 257/531
[58] Field of Search ............................... 438/3, 381, 678, 438/686; 29/602.1; 257/277, 295, 531; 366/200, 208, 219, 232

[56] References Cited

U.S. PATENT DOCUMENTS

| | | | |
|---|---|---|---|
| 3,993,808 | 11/1976 | Inaba et al. | 427/377 |
| 5,070,317 | 12/1991 | Bhagat | 336/200 |
| 5,242,861 | 9/1993 | Inaba | 437/190 |
| 5,266,519 | 11/1993 | Iwamoto | 437/183 |
| 5,272,111 | 12/1993 | Kosaki | 438/614 |
| 5,308,796 | 5/1994 | Feldman et al. | 437/200 |
| 5,466,614 | 11/1995 | Yakura et al. | 438/14 |
| 5,478,773 | 12/1995 | Dow et al. | 437/60 |
| 5,801,100 | 9/1998 | Lee et al. | 438/678 |
| 5,884,990 | 3/1999 | Burghartz et al. | 29/602.1 |

OTHER PUBLICATIONS

Burghartz et al, "High–Q inductors in Standard Silicon Interconnect Technology and Its Application to an Integrated RF Power Amplifier" IEDM '95 p1015–1017.

Yamaguchi et al, "Characteristics And Analysis of A Thin Film Inductor With Closed Magnetic Circuit Structures" IEEE Transaction on Magnetic, vol. 82, No. 5, Sep. 1992, p 3015–3017.

*Primary Examiner*—Donald L. Monin, Jr.
*Assistant Examiner*—Michael Dietrich
*Attorney, Agent, or Firm*—George O. Saile; Stephen B. Ackerman; William J. Stoffei

[57] ABSTRACT

The present invention provides a method of manufacturing an inductor element 46 using an electroless Au plating solution. The invention has three embodiments for forming the inductor. In the first embodiment, a first insulating layer 30 is formed over a semiconductor structure 10 20. An adhesion layer 34 composed of polysilicon is formed over the first insulating layer 30. A first barrier layer 36 comprised of Ni is selectively formed using an Ni electroless plating process over the adhesion layer 34. In an important step, a gold layer 40 is electroless plated over the first barrier layer 36 using an Au electroless plating process. A second barrier layer 44 is formed over the gold layer 40 using an electroless Ni deposition technique. A planarization layer is formed over the second barrier layer. A novel core metal layer composed of a Fe—Co alloy is electroless plated over the planarization layer. The second and third embodiments vary in the process of defining the gold electroless inductor by forming the inductor in a trench. The gold electroless inductor 46 can withstand high current densities without suffering from electromigration effects and is highly corrosion resistant.

25 Claims, 11 Drawing Sheets

ELECTROLESS GOLD PLATING METHOD FOR FORMING INDUCTOR STRUCTURES

BACKGROUND OF THE INVENTION

1) Field of the Invention

This invention relates generally to a method for forming an inductor for a semiconductor device and more specifically to a method for plating a gold layer using an electroless process.

2) Description of the Prior Art

The communications field requires high frequency products for portable applications in the RF and microwave frequency ranges. The integrated circuits that help meet tasks need generally require passive components such as capacitors and inductors for tuning, LC tanks, AC coupling, impedance matching and filtering requirements. However, with regard to inductors, integrating inductors on the same substrate with active and/or passive components has been problematic. Moreover, the inductor resistance must be reduced to improve device performance.

Gold is an attractive material from which to fabricate inductor elements. However, conventional methods of forming gold inductors, such as electrolytic plating and sputtering, have not been successful. The processes are costly and often involve harmful/detrimental etch steps. There is a need for improved methods to form inductors that have lower resistance, lower costs, and less process etch steps.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,266,519(Iwanoto) which shows a method of forming a metal conductor using a selective deposition of Gold. U.S. Pat. No. 5,308,796(Feldman) shows a method of selectively depositing Cu over a metal silicide. U.S. Pat. No. 3,993,808 (Inaba et al.) shows a method of electroless plating Gold on Tungsten. U.S. Pat. No. 5,242,861(Inaba) show a method of forming a multi-layered structure having a gold under layer. U.S. Pat. No. 5,272,111(Kosaki) shows a method of forming a contact having a Au deposited on a Ni—P layer. U.S. Pat. No. 5,478,773(Dow) shows a Copper inductor. Burghartz et al., "High -Q inductors in Standard Silicon Interconnect Technology and its Application to an Integrated RF Power Amplifier", IEDM 95, pp. 1015 to 1017, discussed inductors. Yamaguchi et al., "Characteristics And Analysis Of A Thin Film Inductor With Closed Magnetic Circuit Structure", IEEE transaction on Magnetic, Vol. 82, No. 5, September 1992, pp. 3015 to 3017 discusses RF sputtering Ni—FE—MO—Cu permalloy films.

However, an improved method is needed to form an inductor for a semiconductor device that uses an electroless process.

SUMMARY OF THE INVENTION

It is an object of the present invention to provide a method for fabricating an inductor element for a semiconductor device that uses a Gold (Au) layer formed by an electroless plating process.

It is an object of the present invention to provide a method for fabricating an inductor element for a semiconductor device having a Gold layer of high reliability and of superior corrosion resistant material.

To accomplish the above objectives, the present invention provides a method of manufacturing an Au inductor element over a barrier layer containing Ni. The Au inductor is deposited using an electroless Au plating solution.

Figure 4A:
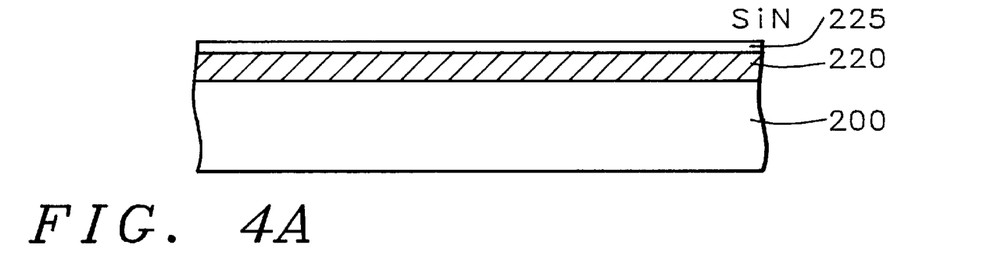
FIGS. 4A through 4k are cross sectional views for illustrating a method for manufacturing an inductor element according to the third embodiment of the present invention. The figures are taken along Axis 1A in FIG. 2A.
Figure 4B:
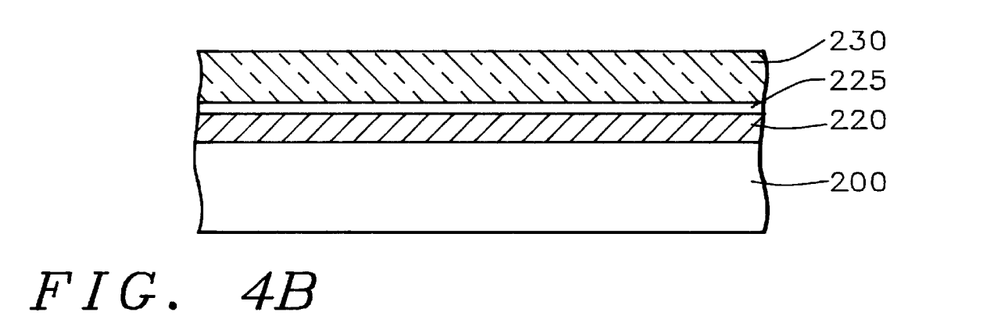
Figure 4C:
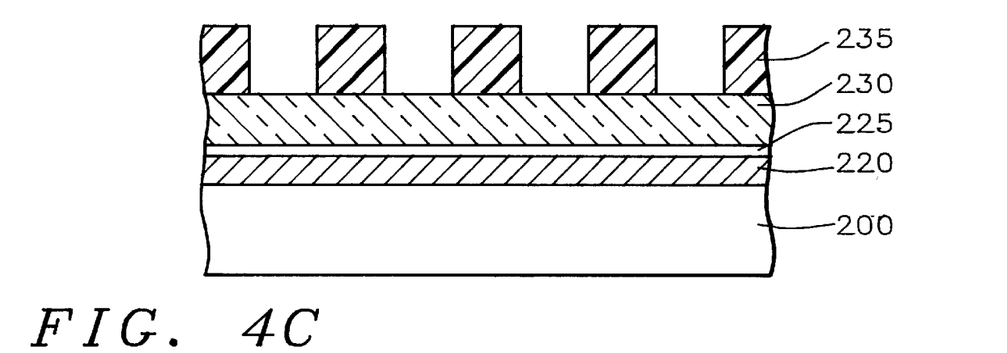
Figure 4D:
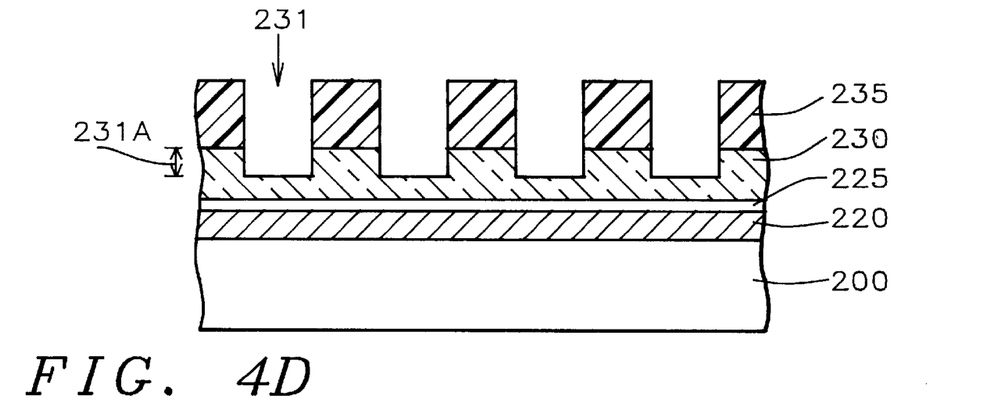
Figure 4E:
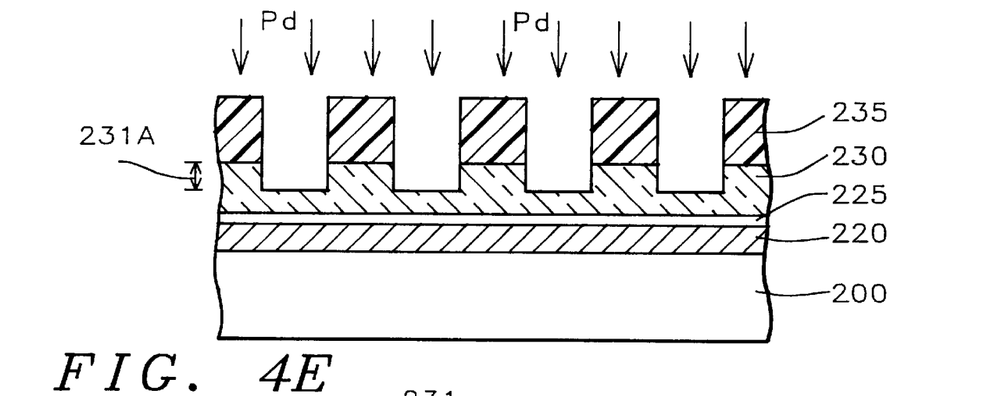
Figure 4F:
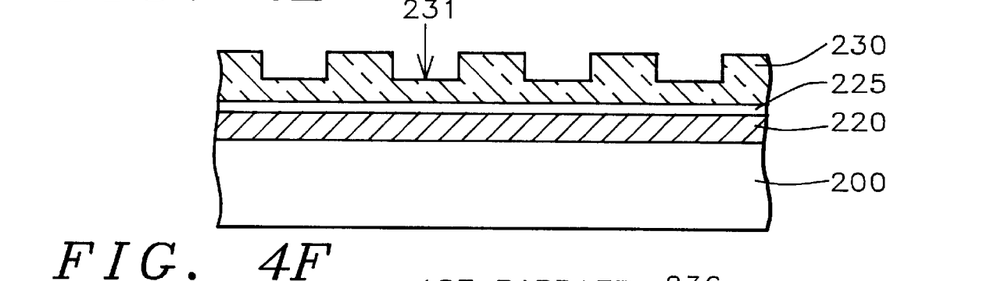
Figure 4G:
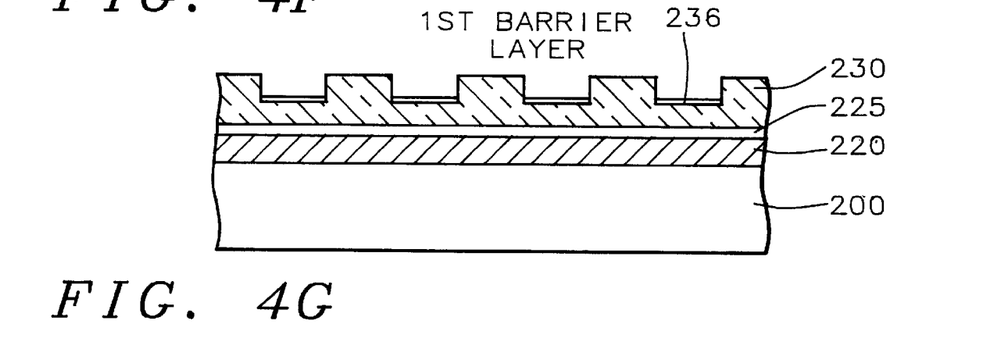
Figure 4H:
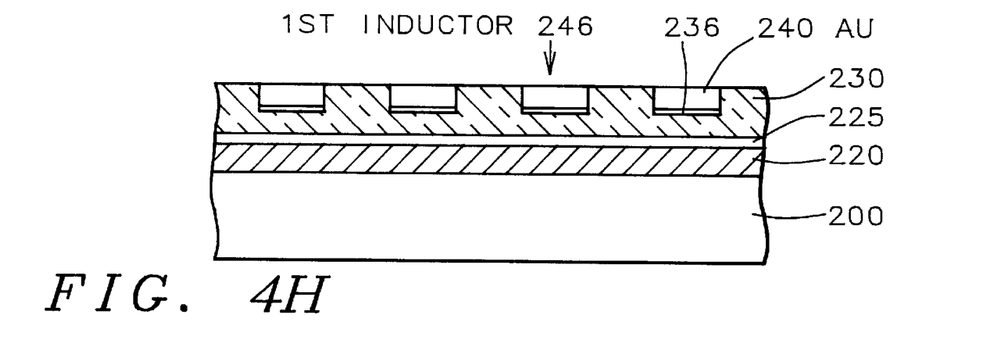
Figure 4I:
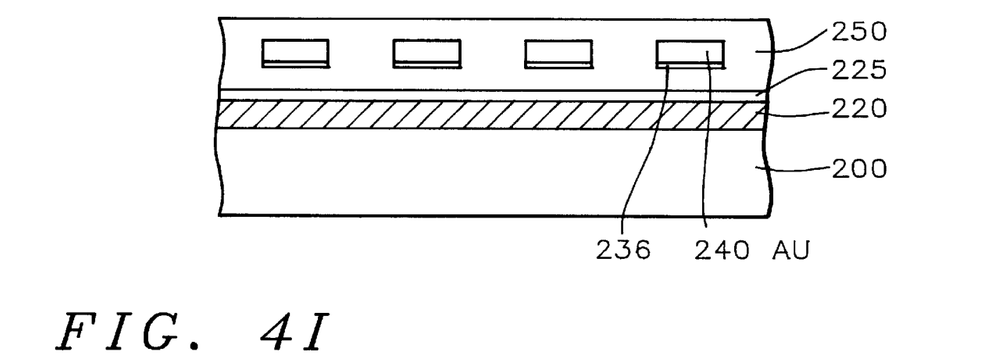
Figure 4J:
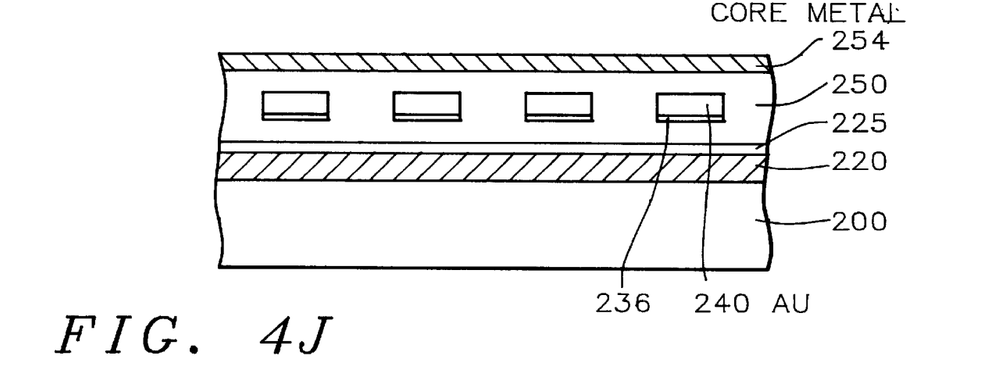
Figure 4K:
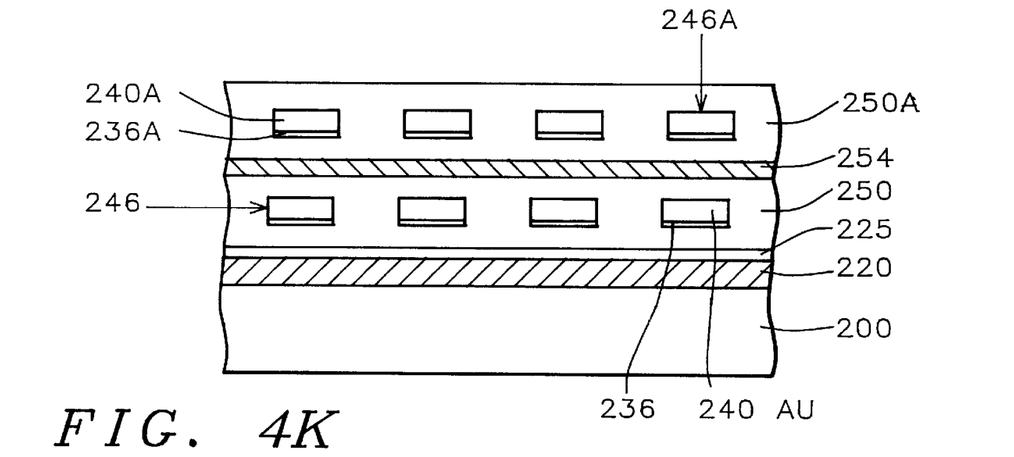

The invention can be described in general as a method of fabricating a gold containing integrated wiring structure 46 for a integrated circuit comprising:

a) See FIG. 4D—forming a first insulating layer 230 over a substrate 10;

b) See FIG. 4G—forming a barrier layer 236 containing nickel (Ni) over said first insulating layer 230;

c) See FIG. 4H—forming a conductor layer containing gold 240 using an electroless deposition process over said barrier layer 236; the conductor layer Au and the barrier layer comprise a first conductor layer.

d) FIG. 4I—forming a planarization layer 250 over the gold layer 240;

e) FIG. 4J—forming core metal layer 254 over the planarization layer 250;

f) FIG. 4K—repeating the above steps to from a second inductor element over the core metal layer 254.

The invention has preferred three embodiments for forming the inductor.

Figure 1A:
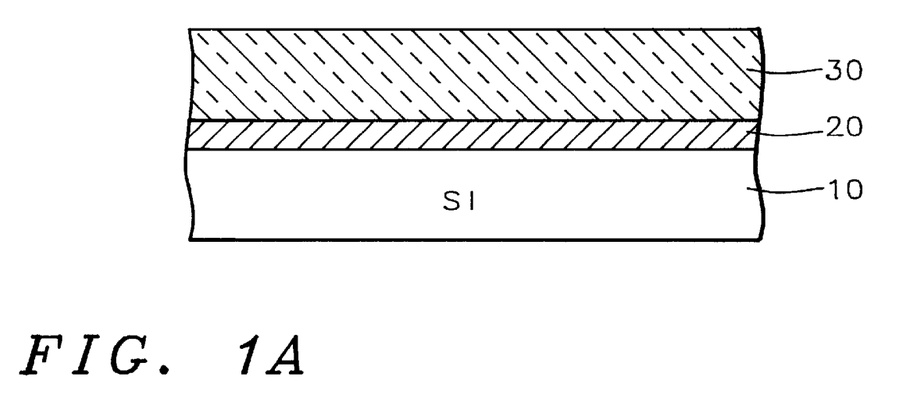
FIGS. 1A through 1I are cross sectional views for illustrating a method for manufacturing an inductor element according to the first embodiment of the present invention. The figures are taken along Axis 1A in FIG. 2A.
Figure 1B:
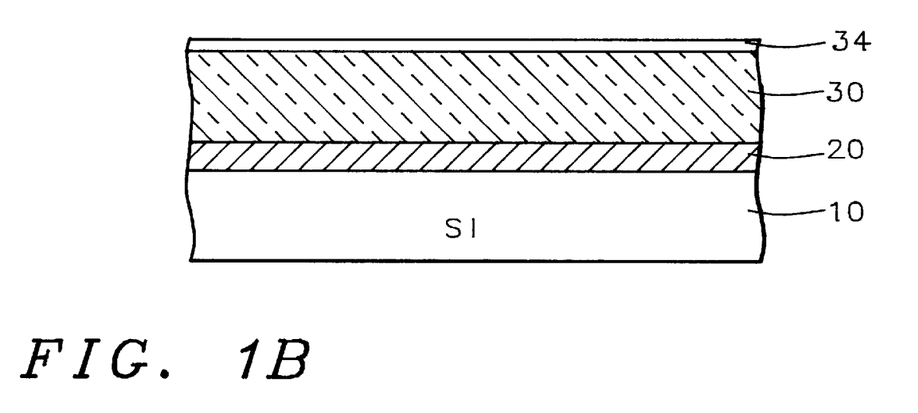
Figure 1C:
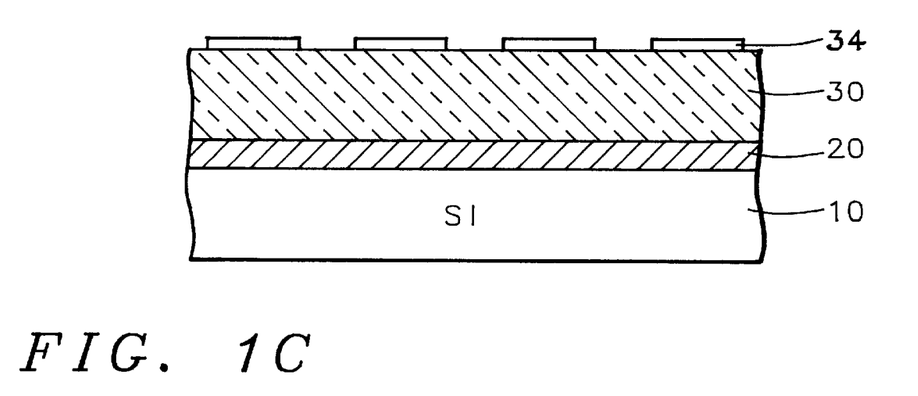
Figure 1D:
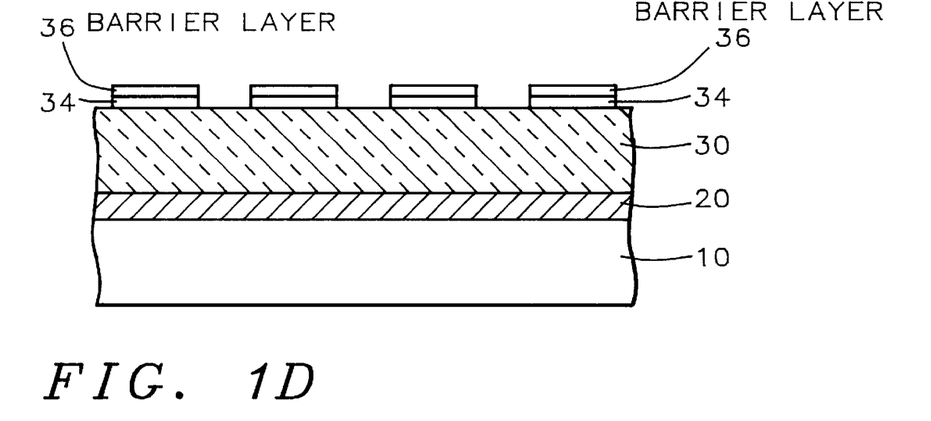
Figure 1E:
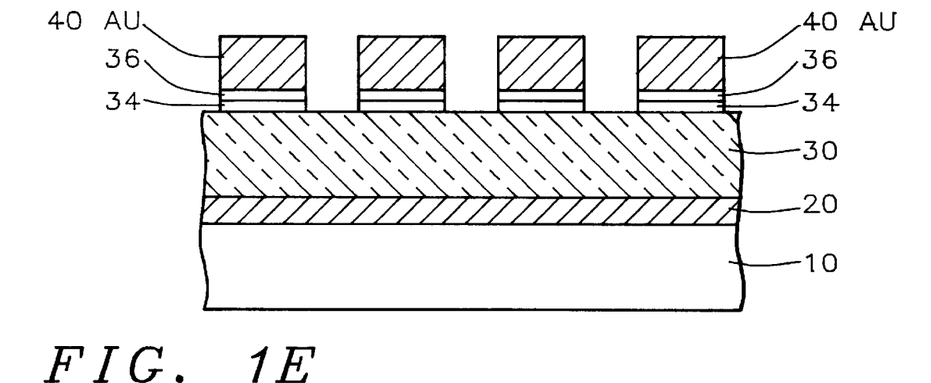
Figure 1F:
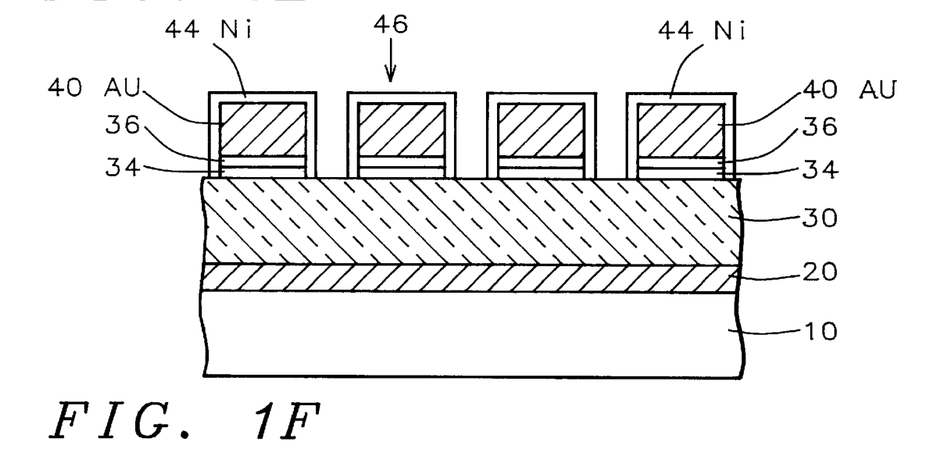
Figure 1G:
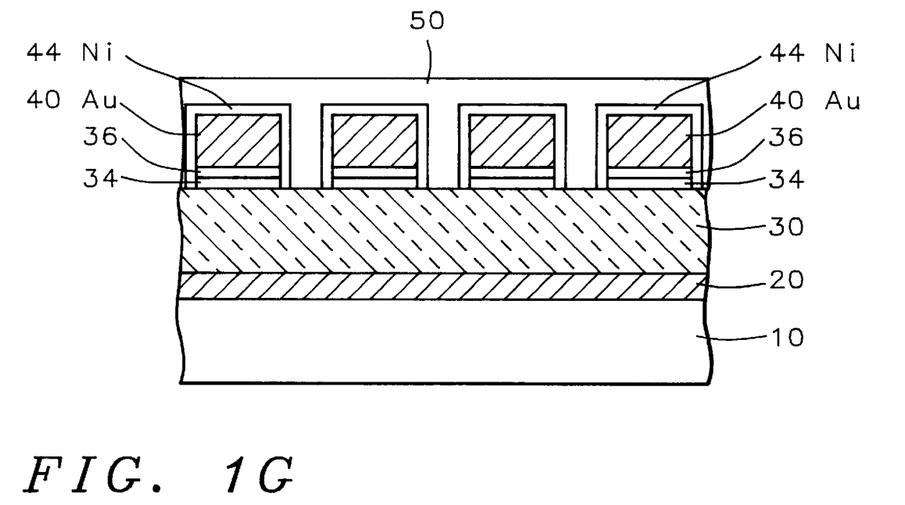
Figure 1H:
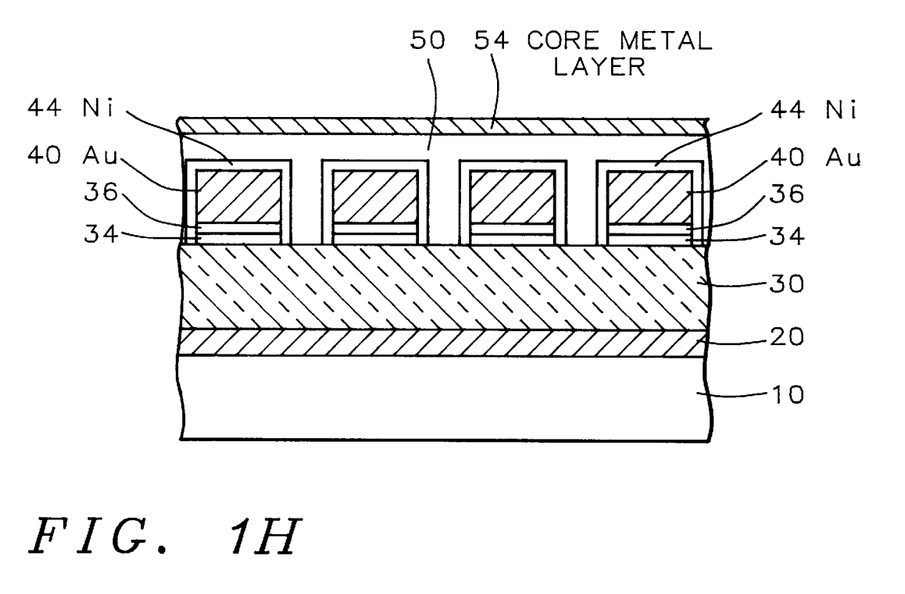
Figure 1I:
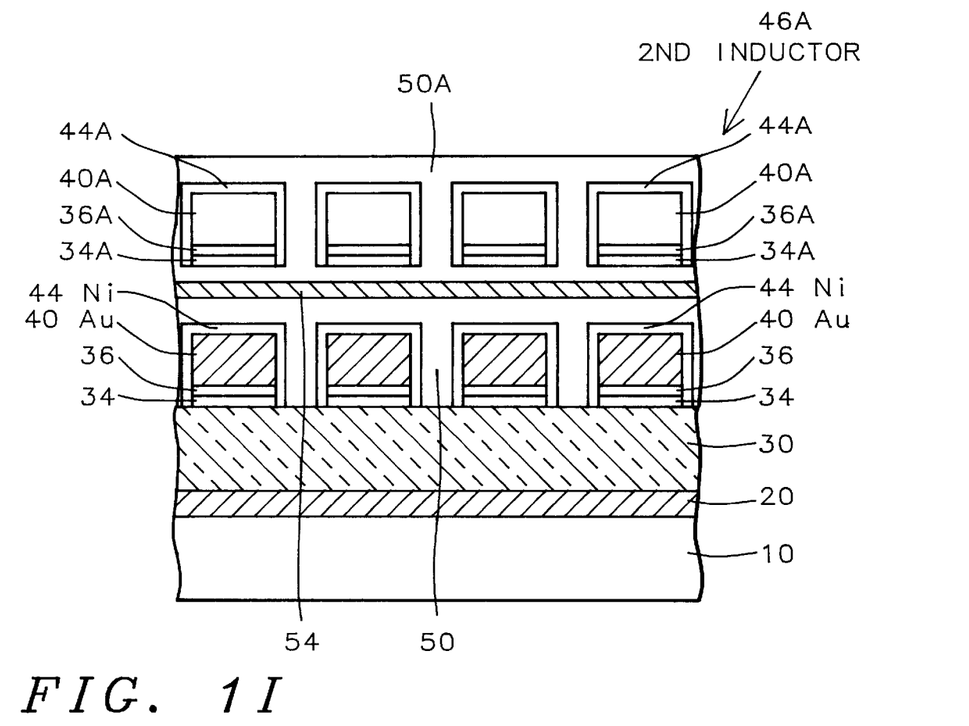

In the first embodiment (Process I), the method for forming an inductor element 46 containing a Au layer 40 over a Ni containing barrier layer 36 for a semiconductor device; comprises the steps of:

a) FIG. 1A—forming a first insulating layer 30 over a semiconductor structure 10 20;

b) FIGS. 1*b* and 1C—forming and patterning an adhesion layer 34 composed of polysilicon over the first insulating layer 30;

c) FIG. 1D—activating the adhesion layer 34 using an Pd electroless activating process thereby forming an activated adhesion layer over the adhesion layer 34;

d) FIG. 1D—selectively forming a first barrier layer 36 comprised of Ni using an Ni electroless plating process over the adhesion layer 34;

e) FIG. 1E—electroless plating a gold layer 40 over the first barrier layer 36 using an Au electroless plating process;

f) (optional) activating the gold layer using a Pd activating process;

g) FIG. 1F—forming a second barrier layer 44 over the gold layer 40 using an electroless Ni deposition technique; the first barrier layer 36, the gold layer 40, the second barrier layer 44 comprise a first inductor element 46;

h) FIG. 1G—forming a planarization layer 50 over the second barrier layer 44;

i) FIG. 1I—forming core metal layer 54 over the planarization layer;

j) repeating the above steps to from a second inductor over the core metal layer 54.

Figure 3A:
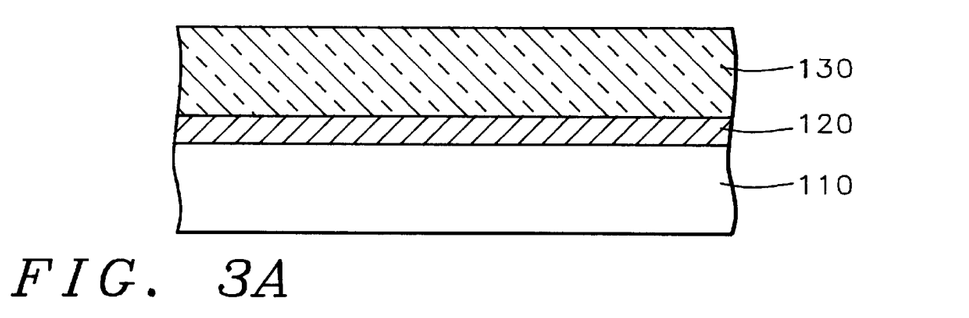
FIGS. 3A through 3J are cross sectional views for illustrating a method for manufacturing an inductor element according to the second embodiment of the present invention. The figures are taken along Axis 1A in FIG. 2A.
Figure 3B:
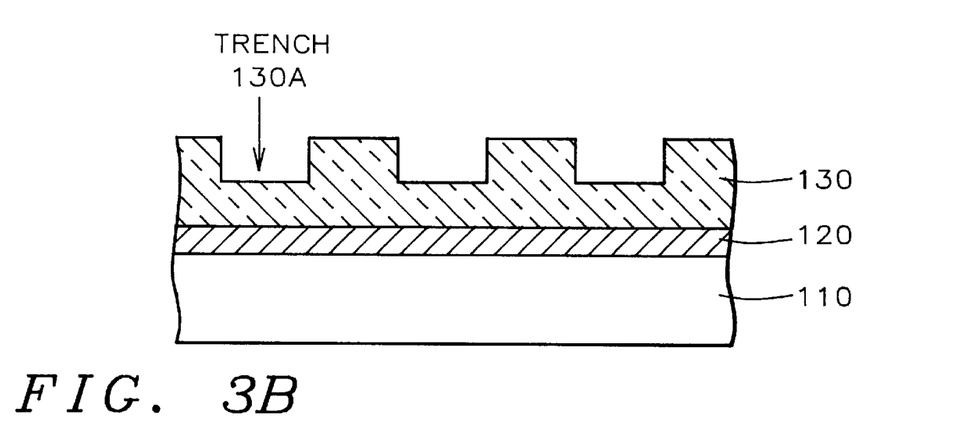
Figure 3C:
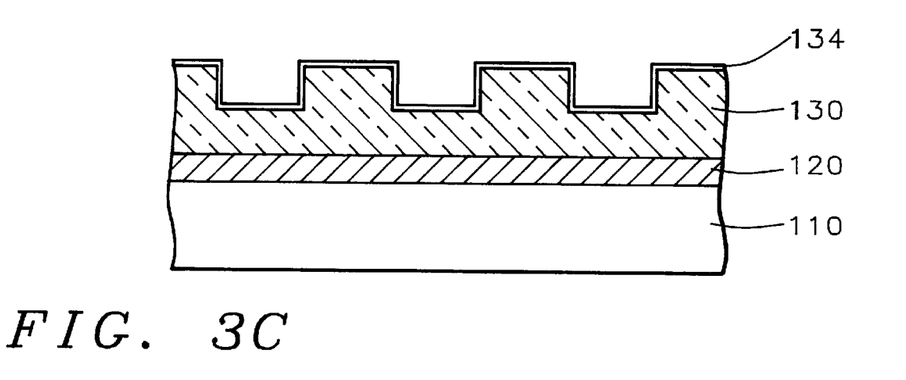
Figure 3D:
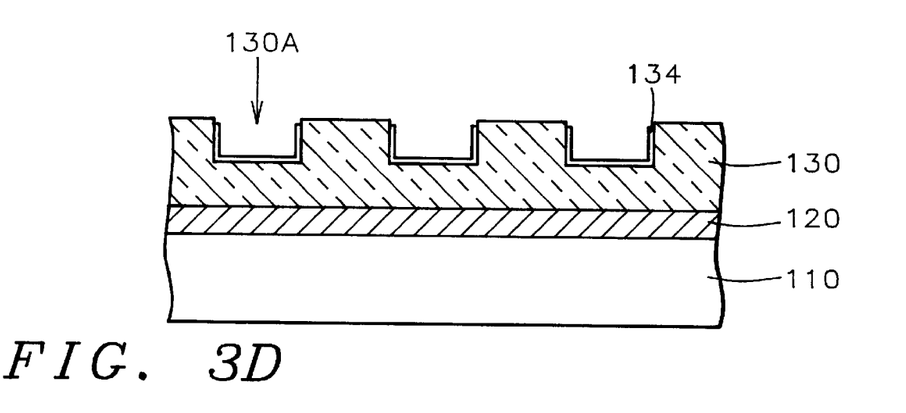
Figure 3E:
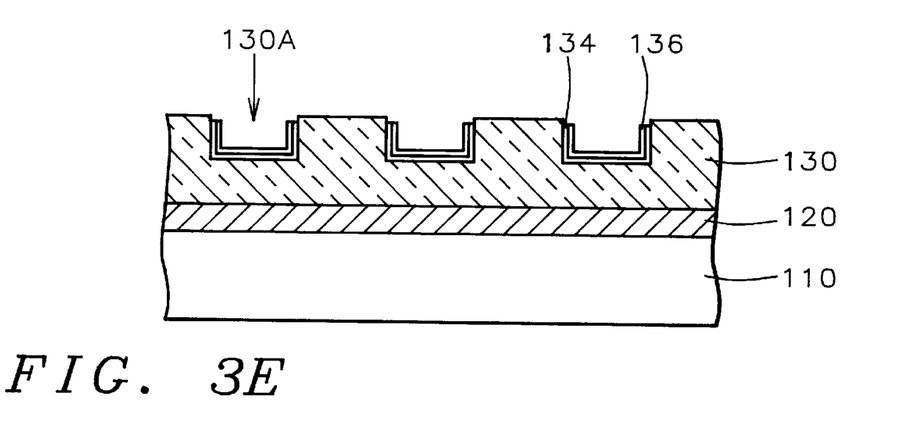
Figure 3F:
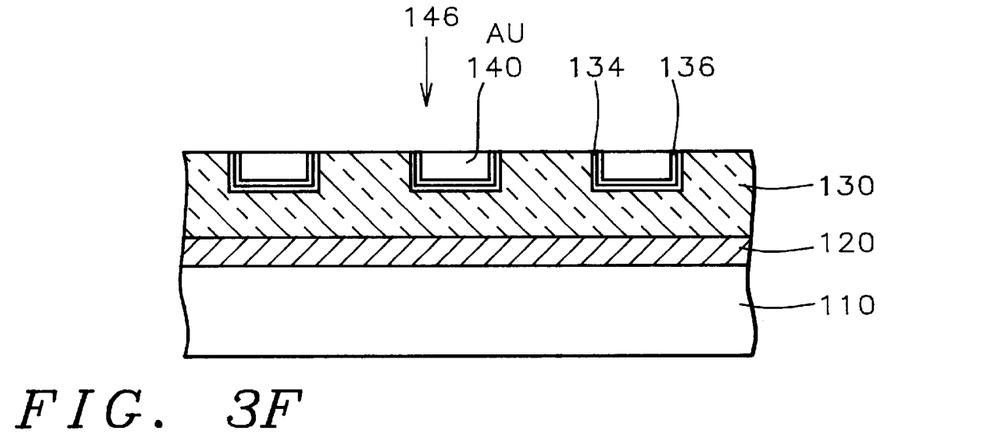
Figure 3G:
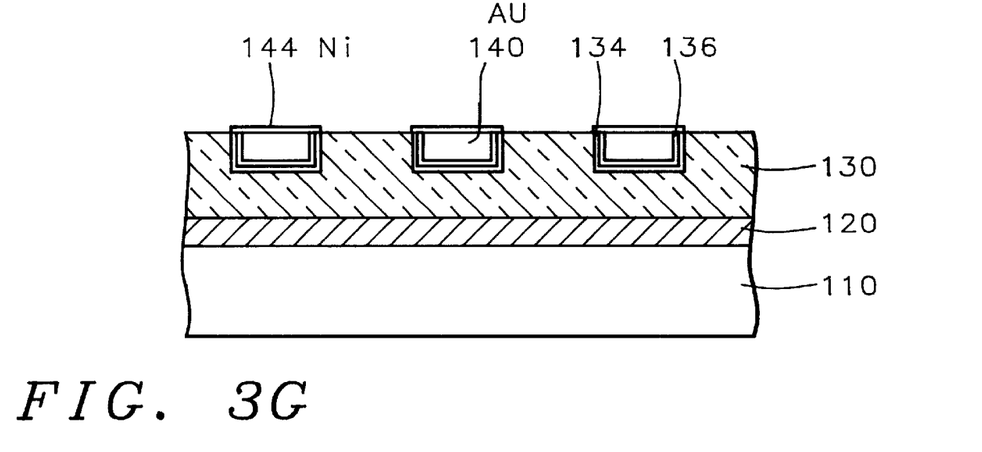
Figure 3H:
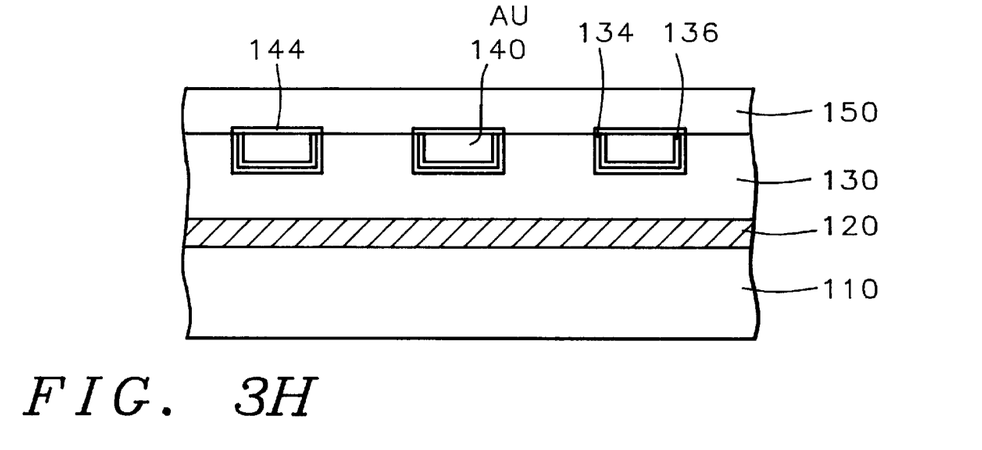
Figure 3I:
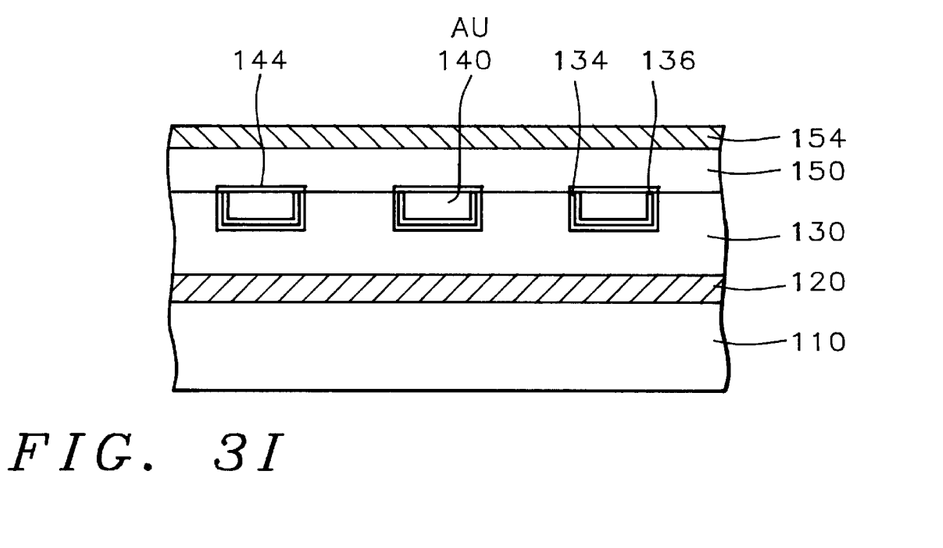
Figure 3J:
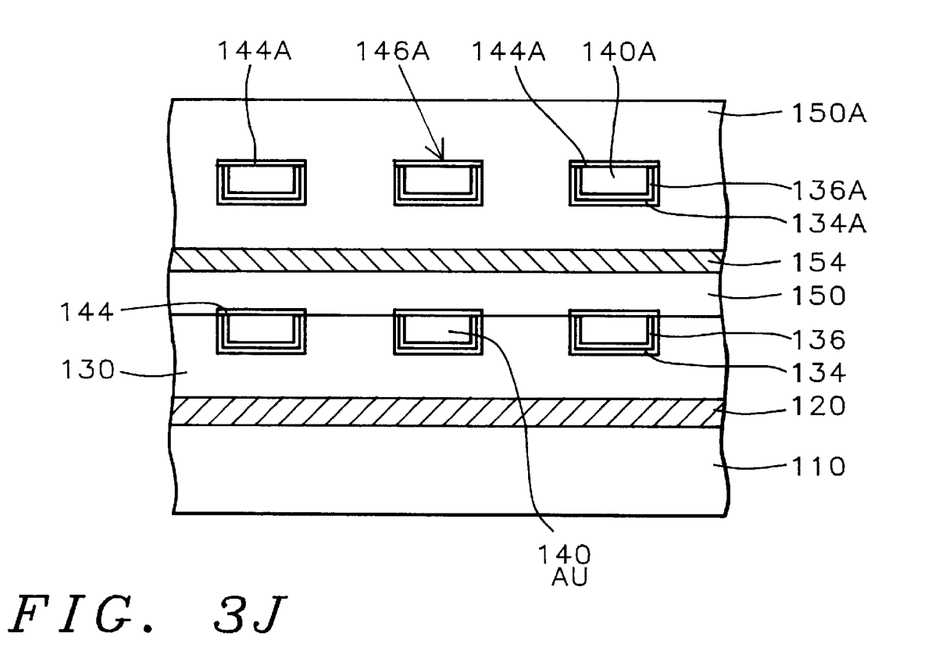

In the second embodiment (Process II), the method comprises the steps of:

a) FIG. 3A—forming first insulating layer 130 over a semiconductor structure 110 120;

b) FIG. 3B—patterning the first insulating layer 130 forming at least a trench 130A; the first insulating layer 130 having sidewalls defining the trench 130A;

c) FIG. 3C—forming an adhesion layer 134 composed of polysilicon over the first insulating layer 130;

d) FIG. 3D—chemically mechanically polishing the adhesion layer 134 leaving the adhesion layer 134 lining the sidewalls of the first insulating layer in the trench 130A;

e) activating the adhesion layer 134 using an Pd electroless activating process f) FIG. 3E—forming a first barrier layer 136 comprised of Ni using an Ni electroless plating solution over the adhesion layer 134 in the trench 130A;

g) FIG. 3f—electroless plating a gold layer 140 over the first barrier layer 136 using an Au electroless plating process filling the trench 130A;

h) activating the gold layer 141 using a Pd activating process;

i) FIG. 3G—forming a second barrier layer 144 over the gold layer 140 using an electroless Ni deposition technique; the first barrier layer 134, the gold layer 140, the second barrier layer 144 comprise a first inductor element 146;

j) FIG. 3H—forming a planarization layer 150 over the second barrier layer 144;

k) FIG. 3I—forming core metal layer 154 over the planarization layer;

l) FIG. 3J—repeating the above steps to from a second inductor element over the core metal layer 154.

In the third embodiment (Process III), the method of fabrication an inductor element 246 for a semiconductor device; comprising the steps of:

a) FIG. 4A—forming a first nitride layer 225 over a semiconductor structure 200 220;

b) FIG. 4B—forming a first insulating layer 230 over the first nitride layer 225;

c) FIG. 4C—forming a first photoresist layer 235 over the first insulating layer; the first photoresist layer having a first opening;

d) FIG. 4D—forming a trench 231 in the first insulating layer 230 using the first photoresist layer 235 as a mask;

e) FIG. 4e—activating the first insulating layer by implanting Pd ions into the first insulating layer in the bottom the trench 231;

f) FIG. 4F—removing the first photoresist layer 235;

g) FIG. 4G—forming a first barrier layer 236 comprised of Ni using an electroless deposition technique over the first insulating layer 236 in the bottom of the trench 231;

h) FIG. 4H—plating a gold layer 240 over the first barrier layer 236 using an electroless deposition technique filling the trench 231; the first barrier layer and the gold layer comprising a first inductor element 246;

i) FIG. 4I—forming a planarization layer 250 over the gold layer 240;

j) FIG. 4J—forming core metal layer 254 over the planarization layer 250;

k) FIG. 4K—repeating the above steps to from a second inductor element over the core metal layer 254.

The three embodiments of the present invention provide a low resistance gold inductor 40 46. The electroless processes, of the invention lower the inductor element resistance. The methods selectively form gold inductors so that expensive and detrimental etch steps are not required. Moreover, the gold inductor is more resistive to corrosive environments. Also, the gold inductor can be operated a considerably high current densities than traditional Al alloys without suffering from electromigration effects. This is because Au has an activation energy of self diffusion in the range of 0.85 to 1.0 eV. The activation energy of self diffusion indicates the upper limit of the current density allowable before breakdown or electromigration effects. In comparison, Aluminum has an activation energy value of about 0.5 eV.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 2A is a top down view of a preferred shape/pattern of the single metal layer inductor element of the present invention. FIG. 2a also represents the inductors formed in the second and third embodiments.

FIG. 2B is a top down view of a preferred shape/pattern of the multilayer inductor element of the present invention. FIG. 2B shows the first inductor 46, core metal layer 54 and second inductor 46A. FIG. 2B also represents the inductors formed in the second and third embodiments.

DETAILED DESCRIPTION OF THE PREFERRED EMBODIMENTS

The present invention will be described in detail with reference to the accompanying drawings.

The invention can be described in general as a method of fabricating a gold containing first inductor (integrated wiring structure) 46 using an electroless process for a integrated circuit. The gold layer 40 is formed over a Ni containing barrier layer 36. A core metal layer 54, composed of electroless Fe—Co, is formed over the first inductor. The core metal layer has a novel composition and process. The process can be repeated to form 2 or more high inductor level and via interconnections can be made between the layer as required.

The general process can be described as follows. As shown in FIG. 4D, forming a first insulating layer 230 over a substrate 10. As shown in FIG. 4G, forming a barrier layer 236 containing nickel (Ni) over said first insulating layer 230. Turning to FIG. 4H, forming a conductor layer containing gold 240 using an electroless deposition process over said barrier layer 236; the conductor layer Au and the barrier layer comprise a first conductor layer. Referring to FIG. 4I, forming a planarization layer 250 over the gold layer 240. As shown in FIG. 4J, forming core metal layer 254 over the planarization layer 250. Turning to FIG. 4K, repeating the above steps to from a second or higher (2nd and third, and forth) inductor element over the core metal layer 254. Detail of these processes are give below in the descriptions of the three preferred embodiments.

First Embodiment (Process I)

In the first embodiment (Process I), the method for forming an inductor element 46 for a semiconductor device is shown in FIGS. 1A to 1F. These descriptions apply to analogous layers/steps in the second and third embodiments.

As shown in FIG. 1A, a first insulating layer 30 is formed over a semiconductor structure 10 20. The first insulating layer 30 is preferably composed of silicon oxide preferably having a thickness in a range of between about 6000 and 10,000 Å.

Semiconductor structure 10 20 is understood to possibly include a semiconductor wafer 10, active and passive devices 20 formed within the wafer and layers 20 formed on the wafer surface. The term "semiconductor structure" is mean to include devices (such as MOSFET's) formed within a semiconductor wafer 10 and the layers 20 overlying the wafer. The term "substrate surface" is meant to include the upper most exposed layers on a semiconductor wafer, such as a silicon surface, an insulating layer and metallurgy lines. The device layer 20 illustrates all possible devices/layers formed over a substrate.

As shown in FIGS. 1b and 1C, an adhesion layer 34 is formed over the first insulating layer 30. The adhesion layer is patterned preferably forming the pattern shown in FIG. 2A. The adhesion layer is preferably composed of polysilicon, Aluminum or doped polysilicon and is most preferably composed of doped polysilicon. The adhesion layer 34 is preferably composed of a doped polysilicon having a thickness in a range of between about 1800 and 2200 Å and using a P or B dopant with a doping concentration in a range of between about 1E14 and 1E16 atoms/cm$^3$.

As shown in FIG. 1C, the patterning the adhesion layer performed by dry etching the adhesion layer 34 to form a pattern of the adhesion layer 34. See FIGS. 2 and 2B.

As shown in FIG. 1D, the adhesion layer 34 is optionally activated preferably using an Pd electroless activating bath forming an activated adhesion layer (not shown in the figs) over the adhesion layer 34.

The Pd electroless activating bath preferably comprises the following composition:

| Reagent | Composition of a Pd activation solution | | |
|---|---|---|---|
| | Low Limit | Target | High limit |
| PdCl2 | 0.1 g | 0.16 g | 0.2 g |
| CH$_3$COOH | 475 ml | 500 ml | 525 ml |
| HF | 25 ml | 250 ml | 275 ml |
| H20 | 200 ml | 245 ml | 300 ml |

As shown in FIG. 1D, a first barrier layer 36 preferably comprised of Ni is selectively formed using an Ni electroless plating solution over the adhesion layer 34. The first barrier layer preferably has a Ni concentration between about 90 and 100 wt % and P concentration between about 0 and 10%. The Ni electroless plating solution preferably comprises one of the three solutions shown below in the tables. The tables show three different P concentration levels.

Table: Composition of an electroless Ni deposition solution (1) - (Low P conc)

| Composition of an electroless Ni deposition solution Reagent | Low Limit | Target | High limit |
|---|---|---|---|
| NiCl$_2$.6H$_2$O | 30 g/L | 32 | 35 g/L |
| NaH$_2$PO$_2$.H$_2$O | 7.5 g/L | 8 | 10 g/L |
| Na$_3$C$_6$H$_5$O$_7$.2H$_2$O | 72 g/L | 75 | 80 g/L |
| NH$_4$Cl | 45 g/L | 48 | 50 g/L |
| The Ni layer 36 contains % phosphorus atoms | 3% | 4% phosphorus atoms | 5% |

Table: Composition of an electroless Ni deposition solution (2) - (medium P concentration)

| | | | |
|---|---|---|---|
| NiSO4.6H20 | 26 | 26–30 g/L | 30 |
| Na3C6H5O7.2H20 | 55 g/L | 60 g/L | 65 g/L |
| (NH4)2SO4 | 60 g/L | 65 g/L | 70 g/L |
| NaH2po2 H20 | 16 g/L | 17 g/L | 18 g/L |
| pH | 8.5 | 9.0 | 9.5 |
| The Ni layer 36 contains (P concentration) | 5.5% | 6.5% P atoms | 7.5% |

Table: Composition of an electroless Ni deposition solution (3) - (Hi Phos concentration)

| | | | |
|---|---|---|---|
| NiCI2-6H20 | 20 | 25 g/L | 30 |
| NaH2po4-H20 | 25 g/L | 25 | 30 g/L |
| Na2C4H404.7H20 | 14 | 16 g/L | 18 |
| pH | 4.6 | 4.8 | 5.0 |
| The deposit contains between | 7.5% | 8.5% P | 9.5% |
| Ni | 90.5% | 91.5% Ni (atomic %) | 92.5% |

The layers formed from these three different P concentration solutions are used as a diffusion barrier material between Au layer 40 and the Al layer 36.

The first Barrier layer 36 can also be composed of Co. However, Co is a high stress film.

Turning to FIG. 1E, a gold layer (gold conductor layer) 40 is electroless plated over the first barrier layer 36 using an Au electroless plating bath.

The Au electroless plating bath preferably comprises one of the following three solutions:

| | Table: Solution 1 | | |
|---|---|---|---|
| | Composition of an electroless Au deposition solution | | |
| Reagent | Low Limit | Target | High limit |
| KAu(CN)$_2$ | 1.8 | 2 g/L | 2.2 |
| NH$_4$Cl | 45 | 50 g/L | 55 |
| Na$_3$C$_6$H$_5$O$_7$.2H$_2$O | 45 | 50 g/L | 55 |
| Na2H2PO2.H20 | 9.5 | 10 g/L | 10.5 |
| | Table: Solution 2 | | |
| KAu(CN)$_2$ | 4 | 5 g/L | 6 |
| KCN | 7 | 8 g/L | 9 |
| NaOH | 18 | 20 g/L | 22 |
| Na$_2$EDTA | 13 | 15 g/L | 17 |

-continued

| | | | |
|---|---|---|---|
| NaBH$_4$ | 23 | 25 g/L | 27 |
| Temperature | 87 | 90° C. | 93 |

Table: Solution 3

| | | | |
|---|---|---|---|
| KAu(CN)$_2$ | 1.8 | 2 g/L | 2.2 |
| NH$_4$Cl | 70 | 75 g/L | 80 |
| Na-citrate (2H$_2$O) | 45 | 50 g/L | 55 |
| Na$_2$H$_2$PO$_2$.H$_2$O | 9.5 | 10 g/L | 10.5 |
| Ph | 7 | | 7.5 |
| Temperature | 90 | 95° C. | 100 |

Next, the gold layer is optionally activated using a Pd activating bath. The Pd activating bath preferably comprises:

| | Composition of a Pd activation solution | | |
|---|---|---|---|
| Reagent | Low Limit | Target | High limit |
| PdCl$_2$ | 0.1 | 0.16 g | 0.2 |
| CH$_3$COOH | 475 | 500 ml | 525 |
| HF | 225 | 250 ml | 275 |
| H20 | 200 | 245 ml | 300 |

This activation is an optional process. We can deposit the Ni layer on the Au layer without any activation processes.

As shown in FIG. 1F, a second barrier layer 44 is formed over the gold layer 40 using an electroless Ni deposition technique (See previous descriptions above for the first embodiment). The first barrier layer 26, the gold layer 40, the second barrier layer 44 make up the first inductor element (first conductor layer) 46. Also see inductor element 12 in FIG. 2A.

As shown in FIG. 1G, a planarization layer 50 is formed over the second barrier layer 44. The planarization layer is preferably composed of spin-on-glass (SOG) and preferably has a thickness in a range of between about 1800 and 2200 Å. The planarization layer is preferably planarized by a chemical-mechanical polish (CMP) or deposition and etch-back process.

As shown in FIG. 1I, a core metal layer 54 is formed over the planarization layer. FIG. 2B shows a top plan view of the structure formed by FIGS. 1I and 1J. (FIG. 2A does not show the core metal layer).

The core metal layer 54 is preferably composed of a Fe—Co alloy and preferably has a thickness in a range of between about 8000 and 12,000 Å. The core metal layer 54 is preferably formed by sputter or electroless Fe—Co techniques—(must form a poly SI over the LTO (SiO$_2$) layer 50).

The core metal 54 is a novel material because this core metal is a ferromagnetic material and can improve the inductance value. The core metal layer is preferably formed by an electroless process as shown in the table below:

Table: Novel Co—Fe—P deposition electroless process for the core metal layer

| Reagent | Low Limit | Target | High limit |
|---|---|---|---|
| COSO$_4$- 5H$_2$O | 22 | 25 g/L | 27 |
| FeSO$_4$ | 0 | 10 g/L | 20 |

Table: Novel Co—Fe—P deposition electroless process for the core metal layer

| Reagent | Low Limit | Target | High limit |
|---|---|---|---|
| *(NH$_4$)2SO$_4$ | 35 | 40 g/L | 45 |
| •Na$_3$C$_6$H$_5$O$_7$.2H$_2$O | 25 | 30 g/L | 35 |
| •NaH2PO2-H20 | 38 | 40 g/L | 42 |
| pH | 8.0 | 8.1 | 8.2 |

As shown in FIG. 1I, the above process steps can be repeated to form a second inductor (second conductor layer) over the core metal layer 54. These processes can be repeated to form additional inductor layers over the second inductor.

Figure 2A:
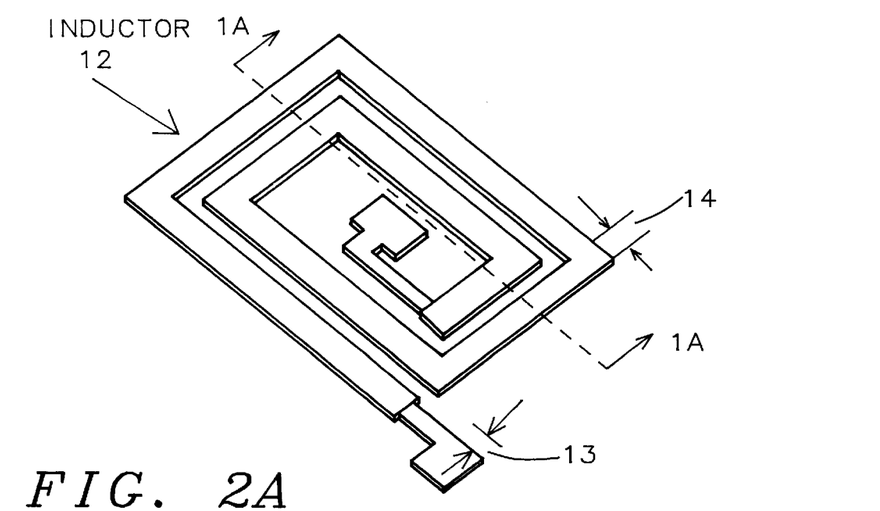
Figure 2B:
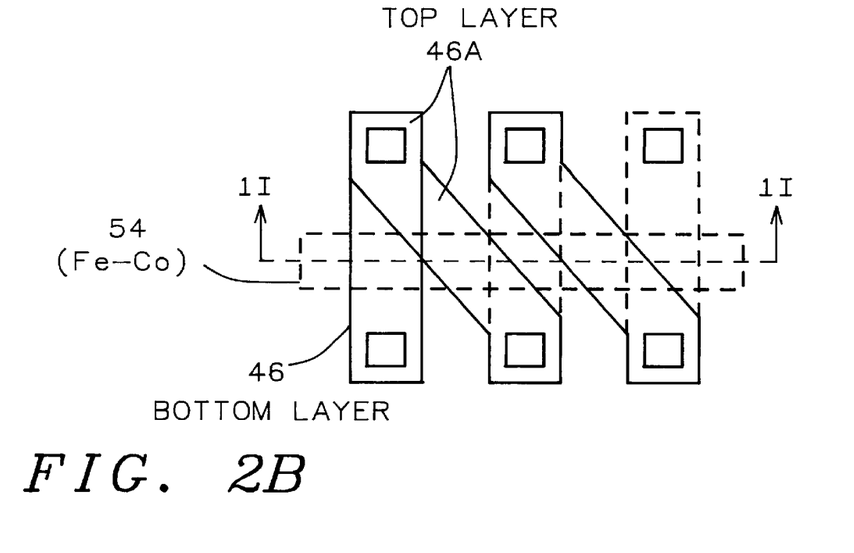

FIG. 2A shows a top down view of the inductor element 12 (46 146 246—all 3 embodiments) of the present invention (only one metal layer). The inductor element preferably has width 14 in a range of between about 5 and 30 µm and more preferably about 10 µm and a spacing 13 in a range of between about 5 µm and 30 and more preferably about 10 µm.

FIG. 2B shows a top plan view of another embodiment of the inductor element of the invention (all three embodiments 46 146 246). FIG. 2B shows a three level inductor structure with the lowest level inductor 46 146 246, a core metal layer (middle level core metal layer) 54 154 254 and a top level inductor 246A.

Second Embodiment (Process II)

In the second embodiment (Process II), the method is shown in FIGS. 3A through 3J. Some of the processes (for analogous layers/steps) used in the second embodiment are described in detail above in the description of the first embodiment.

As shown in FIG. 3A, a first insulating layer 130 is formed over a semiconductor structure 110 120. The first insulating layer 130 is preferably composed of silicon oxide preferably having a thickness in a range of between about 16,000 and 20,000 Å.

Turning to FIG. 3B, the first insulating layer 130 is patterned forming at least a trench 130A. The first insulating layer 130 has sidewalls defining the trench 130A.

Referring to FIG. 3C, an adhesion layer 134 is formed over the first insulating layer 130. The adhesion layer 134 is preferably composed of a doped polysilicon having a thickness in a range of between about 1800 and 2200 Å.

As shown in FIG. 3D, the adhesion layer 134 is chemically mechanically polished leaving the adhesion layer 134 lining the sidewalls of the first insulating layer in the trench 130A.

Next, the adhesion layer 134 is optically activated so that the subsequent layer selectively deposits over the adhesion layer. Preferably, the adhesion layer 134 is activated using a Pd electroless activating process/bath(s). Preferably the Pd electroless activating bath is has a composition as shown above in the first embodiment.

As shown in FIG. 3E, a first barrier layer 136 is formed over the adhesion layer 134 in the trench 130A. The first barrier layer 136 is preferably comprised of Ni and is formed using an Ni electroless plating process/solution (as discussed in the first embodiment above).

Alternately, the first Barrier layer 136 can be composed of Co. However, Co is a high stress film.

As shown in FIG. 3f, a gold layer 140 is electroless plated over the first barrier layer 136 using an Au electroless plating bath filling the trench 130A. The Au electroless plating process/bath is preferably the same as discussed above in the first embodiment.

Next, the gold layer 141 is optionally activated using a Pd activating bath (as discussed in the first embodiment).

Turning to FIG. 3G, a second barrier layer 144 is formed over the gold layer 140 preferably using an electroless Ni deposition technique.

The first barrier layer 134, the gold layer 140, the second barrier layer 144 comprises the first inductor element 146.

As shown in FIG. 3H, a planarization layer 150 is formed over the second barrier layer 144. The planarization layer 150 is preferably composed of spin-on-glass (SOG) having a thickness in a range of between about 1800 and 2200 Å.

Referring to FIG. 3I, a novel core metal layer 154 is formed over the planarization layer. The core metal layer 154 is preferably composed of a Fe—Co alloy having a thickness in a range of between about 8000 and 12,000 Å. The core metal layer 154 formed by sputter or electroless Fe—Co techniques—(must form a poly SI over the LTO (SiO$_2$) layer 150). See above description of first embodiment for the process and specifications of the core metal layer 50 150 250.

As shown in FIG. 3J, the above steps are preferably repeated to form a second inductor element over the core metal layer 154.

Third Embodiment (Process III)

In the third embodiment (Process III), the method of fabrication an inductor element 246 for a semiconductor device is shown in FIGS. 4A through 4k and FIGS. 2a & 2B.

As shown in FIG. 4A, a first nitride layer 225 is formed over a semiconductor structure 200 220. The first nitride layer preferably has a thickness in a range of between about 1000 and 2000 Å and more preferably about 1500 Å.

As shown in FIG. 4B, a first insulating layer 230 (Dielectric layer) is formed over the first nitride layer 225.

Turning to FIG. 4C, a first photoresist layer 235 is formed over the first insulating layer. The first photoresist layer having first openings where trenches will be formed.

As shown in FIG. 4D, trenches 231 are formed in the first insulating layer 230 using the first photoresist layer 235 as a mask. The trench 231 preferably has a depth in a range of between about 16,000 and 20,000 Å.

Referring to FIG. 4e, the first insulating layer is optionally activated by implanting Pd ions into the first insulating layer in the bottom the trench 231. The implantation of the first insulating layer 230 performed by implanting Pd ions at an energy in a range of between about 30 Kev and 50 Kev and more preferably about 40 Kev and the first insulating layer having a Pd concentration in a range of between about 1E15 and 1E16 atoms/c.c. and more preferably about 5E15 atoms/cm$^3$.

Next, as shown in FIG. 4F, the first photoresist layer 235 is removed.

As shown in FIG. 4G, a first barrier layer 236 preferably comprised of Ni is formed using an electroless deposition technique over the adhesion layer 234 in the bottom of the trench 231. The first Barrier layer can also be composed of Co as discussed above.

As shown in FIG. 4H, a gold layer 240 is selectively plated over the first barrier layer 236 using an electroless deposition technique filling the trench 231. The first barrier layer 236 and the gold layer 250 comprises a first inductor element 246. The gold layer 240 preferably has a thickness in a range of between about 8000 and 12,000 Å.

As shown in FIG. 4I, a planarization layer 250 is formed over the gold layer 240. The planarization layer is preferably composed of spin-on-glass (SOG) having a thickness in a range of between about 1800 and 2200 Å.

As shown in FIG. 4J, core metal layer 254 is formed over the planarization layer 250. The core metal layer 254 has the properties as discussed above.

As shown in FIG. 4K, the above steps are repeated to from a second inductor element 240 A 236 A over the core metal layer 254.

The present invention related to methods of forming integrated circuit structures within silicon integrated circuits. This invention related to an electroless Au plating method for manufacturing Au containing integrated circuits structures within integrated circuits. This invention provides a method of forming an Au containing integrated circuit structure within an integrated circuit, where there is avoided inter-diffusion of a Au containing conductor layer 40 within the gold containing integrated circuit structure.

The three embodiments of the present invention provide a low resistance gold inductor. The electroless processes of the invention lower the inductor element resistance. The methods selectively form gold inductors so that expensive and detrimental etch steps are not required. Moreover, the gold inductor is more resistive to corrosive environments. Also, the gold inductor can be operated a considerably high current densities than traditional Al alloys without suffering from electromigration effects. The gold inductor has an activation energy of self diffusion in the range of 0.85 to 1.0 eV. This activation energy of the gold inductor is a benefit due to the self diffusion of Au is higher than Al.

In addition, the Au film is a low resistivity material but it is difficult to pattern. Wet etching is not VLSI compatible because it typically causes severe loss of pattern fidelity. Hence the electroless method of the invention is an excellent choice.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a gold containing integrated wiring structure for an integrated circuit comprising:

a) forming a first insulating layer over a substrate;

b) forming a barrier layer containing nickel using an electroless deposition process over said first insulating layer;

c) forming a gold conductor layer using an electroless deposition process over said barrier layer; said gold conductor layer and said barrier layer comprise a first conductor layer;

d) forming a planarization layer over said gold conductor layer;

e) forming a core metal layer composed of Fe—Co alloy using an electroless deposition process over the planarization layer; said core metal layer is formed by an electroless plating process having a solution comprising: KAu(CN)$_2$ with a concentration between about 4 and 6 g/L, KCN with a concentration between about 7 and 9 g/L, NaOH with a concentration between about 18 and 22 g/L, Na$_2$EDTA with a concentration between about 13 and 17 g/L, NaBH$_4$ with a concentration between about 23 and 27 g/L, and at a temperature between about 87 and 93° C.

2. The method of claim 1 which further includes:
repeating the above steps of claim 1 to form a second conductor layer over the core metal layer.

3. The method of claim 1 wherein said barrier layer containing nickel is formed by an electroless plating process and barrier layer has a Ni concentration between about 90 and 100 wt % and P concentration between about 0 and 10 wt %.

4. The method of claim 2 wherein said core metal layer is composed of Co and is formed by an electroless plating process.

5. A method of fabrication an inductor element for a semiconductor device; comprising the steps of:
 a) forming a first insulating layer over a semiconductor structure;
 b) forming and patterning an adhesion layer composed of polysilicon over said first insulating layer;
 c) selectively forming a first barrier layer comprised of Ni using an Ni electroless plating solution over said adhesion layer;
 d) electroless plating a gold layer over said first barrier layer using an Au electroless plating bath;
 e) forming a second barrier layer composed of Ni over said gold layer using an electroless Ni deposition technique; said first barrier layer, said gold layer, said second barrier layer comprise a first inductor element;
 f) forming a planarization layer over said second barrier layer;
 g) forming a core metal layer composed of Fe—Co using an electroless deposition process over said planarization layer.

6. The method of claim 5 wherein said first insulating layer is composed of silicon oxide having a thickness in a range of between about 6000 and 10,000 Å.

7. The method of claim 5 wherein said adhesion layer composed of a doped polysilicon having a thickness in a range of between about 1800 and 2200 Å and a doping concentration in a range of between about 1E14 and 1E16 Atoms/cm$^3$.

8. The method of claim 5 which further includes wherein activating said adhesion layer using an Pd electroless activating process forming an activated adhesion layer over said adhesion layer.

9. The method of claim 5 wherein said first barrier layer containing nickel is formed by an electroless plating process and said first barrier layer has a Ni concentration between about 90 and 100 wt % and P concentration between about 0 and 10 wt %.

10. The method of claim 5 wherein said core metal layer composed of a Fe—Co alloy having a thickness in a range of between about 8000 and 12000 Å; said core metal layer formed by sputter or electroless Fe—Co techniques.

11. The method of claim 5 wherein said core metal layer is formed by an electroless plating process having a solution comprising: KAu(CN)$_2$ with a concentration between about 4 and 6 g/L, KCN with a concentration between about 7 and 9 g/L, NaOH with a concentration between about 18 and 22 g/L, Na$_2$EDTA with a concentration between about 13 and 17 g/L, NaBH$_4$ with a concentration between about 23 and 27 g/L, and at a temperature between about 87 and 93° C.

12. The method of claim 5 which further includes repeating steps (a) through (g) to from a second inductor over said core metal layer.

13. A method of fabrication an inductor element for a semiconductor device; comprising the steps of:
 a) forming a first insulating layer over a semiconductor structure;
 b) forming and patterning an adhesion layer composed of polysilicon over said first insulating layer; said adhesion layer composed of a doped polysilicon having a thickness in a range of between about 1800 and 2200 Å and a doping concentration in a range of between about 1E14 Atoms/cm$^3$ and 1E16 Atoms/cm$^3$;
 c) activating said adhesion layer using an Pd electroless activating bath forming an activated adhesion layer over said adhesion layer;
 d) selectively forming a first barrier layer comprised of Ni using an Ni electroless plating solution over said adhesion layer; said first barrier layer containing nickel is formed by an electroless plating process and said first barrier layer has a Ni concentration between about 90 and 100 wt % and P concentration between about 0 and 10 wt %;
 e) electroless plating a gold layer over said first barrier layer using an Au electroless plating process;
 f) activating said gold layer using a Pd activating process;
 g) forming a second barrier layer over said gold layer using an electroless Ni deposition technique; said first barrier layer, said gold layer, said second barrier layer comprise a first inductor element;
 h) forming a planarization layer over said second barrier layer;
 i) forming a core metal layer composed of Fe—Co using an electroless deposition process over said planarization layer; said core metal layer composed of a Fe—Co alloy having a thickness in a range of between about 8000 and 12000 Å; said core metal layer is formed by an electroless plating process having a solution comprising: KAu(CN)$_2$ with a concentration between about 4 and 6 g/L, KCN with a concentration between about 7 and 9 g/L, NaOH with a concentration between about 18 and 22 g/L, Na$_2$EDTA with a concentration between about 13 and 17 g/L, NaBH$_4$ with a concentration between about 23 and 27 g/L, and at a temperature between about 87 and 93° C.

14. The method of claim 13 which further includes repeating the above steps to from a second inductor over said core metal layer.

15. A method of fabrication an inductor for a semiconductor device; comprising the steps of:
 a) forming first insulating layer over a semiconductor structure;
 b) patterning said first insulating layer forming at least a trench; said first insulating layer having sidewalls defining said trench;
 c) forming an adhesion layer composed of polysilicon over said first insulating layer;
 d) chemically mechanically polishing said adhesion layer leaving said adhesion layer lining said sidewalls of said first insulating layer in said trench;
 e) forming a first barrier layer comprised of Ni using an Ni electroless plating solution over said adhesion layer in said trench;

f) electroless plating a gold layer over said first barrier layer using an Au electroless plating process filling said trench;

g) forming a second barrier layer over said gold layer using an electroless Ni deposition technique; said first barrier layer, said gold layer, said second barrier layer comprise a first inductor element;

h) forming a planarization layer over said second barrier layer; and i) forming a core metal layer over said planarization layer.

16. The method of claim 15 wherein said first insulating layer composed of silicon oxide having a thickness in a range of between about 16,000 and 20,000 Å.

17. The method of claim 15 wherein said adhesion layer composed of a doped polysilicon having a thickness in a range of between about 1000 and 2200 Å.

18. The method of claim 15 wherein said planarization layer is composed of spin-on-glass having a thickness in a range of between about 1800 and 2000 Å.

19. The method of claim 15 wherein said core metal layer composed of a Fe—Co alloy having a thickness in a range of between about 8000 and 10,000 Å; said core metal layer formed by sputter or electroless Fe—Co techniques.

20. The method of claim 15 wherein said core metal layer is formed by an electroless plating process having a solution comprising: $KAu(CN)_2$ with a concentration between about 4 and 6 g/L, KCN with a concentration between about 7 and 9 g/L, NaOH with a concentration between about 18 and 22 g/L, $Na_2EDTA$ with a concentration between about 13 and 17 g/L, $NaBH_4$ with a concentration between about 23 and 27 g/L, and at a temperature between about 87 and 93° C.

21. A method of fabrication an inductor for a semiconductor device; comprising the steps of:

a) forming first insulating layer over a semiconductor structure;

b) patterning said first insulating layer forming at least a trench; said first insulating layer having sidewalls defining said trench;

c) forming an adhesion layer composed of polysilicon over said first insulating layer; said adhesion layer composed of a doped polysilicon having a thickness in a range of between about 1000 and 2200 Å;

d) chemically mechanically polishing said adhesion layer leaving said adhesion layer lining said sidewalls of said first insulating layer in said trench;

e) activating said adhesion layer using an Pd electroless activating bath;

f) forming a first barrier layer comprised of Ni using an Ni electroless plating solution over said adhesion layer in said trench;

g) electroless plating a gold layer over said first barrier layer using an Au electroless plating process filling said trench;

h) activating said gold layer using a Pd activating bath;

i) forming a second barrier layer over said gold layer using an electroless Ni deposition technique; said first barrier layer, said gold layer, said second barrier layer comprise a first inductor element;

j) forming a planarization layer over said second barrier layer;

k) forming a core metal layer over said planarization layer; said core metal layer composed of a Fe—Co alloy having a thickness in a range of between about 8000 and 10,000 Å; said core metal layer is formed by an electroless plating process having a solution comprising: $KAu(CN)_2$ with a concentration between about 4 and 6 g/L, KCN with a concentration between about 7 and 9 g/L, NaOH with a concentration between about 18 and 22 g/L, $Na_2EDTA$ with a concentration between about 13 and 17 g/L, $NaBH_4$ with a concentration between about 23 and 27 g/L, and at a temperature between about 87 and 93° C.

22. A method of fabrication an inductor element for a semiconductor device; comprising the steps of:

a) forming a first insulating layer over a substrate;

b) forming a first photoresist layer over said first insulating layer; said first photoresist layer having a first opening;

c) forming a trench in said first insulating layer using said first photoresist layer as a mask;

d) removing said first photoresist layer;

e) forming a first barrier layer comprised of Ni using an electroless deposition technique over said adhesion layer in said bottom of said trench;

f) plating a gold layer over said first barrier layer using an electroless deposition technique filling said trench; said first barrier layer and said gold layer comprising a first inductor element;

g) forming a planarization layer over said gold layer;

h) forming a core metal layer over said planarization layer.

23. The method of claim 22 wherein activating said first insulating layer by implanting Pd ions into said first insulating layer in the bottom said trench; the implantation of said first insulating layer performed by implanting Pd ions at an energy in a range of between about 30 Kev and 50 Kev and more preferably about 40 Kev and said first insulating layer having a Pd concentration in a range of between about 1E15 and 1E16 atoms/cm³ and more preferably about 5E15 atoms/cm³.

24. The method of claim 22 wherein said core metal layer composed of a Fe—Co alloy having a thickness in a range of between about 8000 and 12,000 Å; said core metal layer is formed by an electroless plating process having a solution comprising: $KAu(CN)_2$ with a concentration between about 4 and 6 g/L, KCN with a concentration between about 7 and 9 g/L, NaOH with a concentration between about 18 and 22 g/L, $Na_2EDTA$ with a concentration between about 13 and 17 g/L, $NaBH_4$ with a concentration between about 23 and 27 g/L, and at a temperature between about 87 and 93° C.

25. A method of fabrication an inductor element for a semiconductor device; comprising the steps of:

a) forming a first nitride layer over a semiconductor structure;

b) forming a first insulating layer over said first nitride layer;

c) forming a first photoresist layer over said first insulating layer; said first photoresist layer having a first opening;

d) forming a trench in said first insulating layer using said first photoresist layer as a mask; said trench having a depth in a range of between about 16,000 and 20,000 Å;

e) activating said first insulating layer by implanting Pd ions into said first insulating layer in the bottom trench; the implantation of said first insulating layer performed by implanting Pd ions at an energy in a range of between about 30 Kev and 50 Kev and more preferably about 40 Kev and said first insulating layer having a Pd concentration in a range of between about 1E15 and 1E16 atoms/CC and more preferably about 5E15 atoms/CC;

f) removing said first photoresist layer;
g) forming a first barrier layer comprised of Ni using an electroless deposition technique over said adhesion layer in said bottom of said trench;
h) plating a gold layer over said first barrier layer using an electroless deposition technique filling said trench; said first barrier layer and said gold layer comprising a first inductor element;
i) forming a planarization layer over said gold layer;
j) forming a core metal layer over said planarization layer; said core metal layer composed of a Fe—Co alloy having a thickness in a range of between about 8000 and 12,000 Å; said core metal layer is formed by an electroless plating process having a solution comprising: $KAu(CN)_2$ with a concentration between about 4 and 6 g/L, KCN with a concentration between about 7 and 9 g/L, NaOH with a concentration between about 18 and 22 g/L, $Na_2EDTA$ with a concentration between about 13 and 17 g/L, $NaBH_4$ with a concentration between about 23 and 27 g/L, and at a temperature between about 87 and 93° C.

* * * * *